(12) United States Patent
Seeger

(10) Patent No.: US 8,516,372 B2
(45) Date of Patent: Aug. 20, 2013

(54) MULTIMEDIA SYSTEM FOR SELECTING AND ACTIVATING FUNCTIONS

(75) Inventor: Isabell Seeger, Aichwald (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 1940 days.

(21) Appl. No.: 11/588,841

(22) Filed: Oct. 27, 2006

(65) Prior Publication Data

US 2007/0200875 A1 Aug. 30, 2007

Related U.S. Application Data

(63) Continuation-in-part of application No. PCT/EP2005/004630, filed on Apr. 29, 2005.

(30) Foreign Application Priority Data

Apr. 30, 2004 (EP) ..................................... 04010242

(51) Int. Cl.
*G06F 3/00* (2006.01)
(52) U.S. Cl.
USPC ............ 715/713; 715/716; 715/853; 715/854
(58) Field of Classification Search
USPC ................................ 715/727, 810
See application file for complete search history.

(56) References Cited

U.S. PATENT DOCUMENTS

| | | | |
|---|---|---|---|
| 6,373,472 B1 | 4/2002 | Palalau et al. | |
| 6,470,178 B1 * | 10/2002 | Cummings-Hill et al. | 455/186.1 |
| 6,539,289 B2 * | 3/2003 | Ogino et al. | 701/1 |
| 6,707,387 B2 * | 3/2004 | Noguchi et al. | 340/691.6 |
| 6,769,320 B1 * | 8/2004 | Bollgohn et al. | 73/866.3 |
| 6,816,079 B1 * | 11/2004 | Kuenzner et al. | 340/815.4 |
| 6,961,644 B2 * | 11/2005 | Mercier et al. | 701/36 |
| 2003/0013815 A1 * | 1/2003 | Wicher | 525/263 |
| 2004/0119683 A1 * | 6/2004 | Warn et al. | 345/156 |
| 2005/0097478 A1 * | 5/2005 | Killian et al. | 715/851 |
| 2005/0172230 A1 * | 8/2005 | Burk et al. | 715/716 |
| 2006/0015819 A1 * | 1/2006 | Hawkins et al. | 715/780 |
| 2009/0225060 A1 * | 9/2009 | Rizoiu et al. | 345/176 |
| 2009/0228175 A1 * | 9/2009 | Borgesson | 701/48 |

FOREIGN PATENT DOCUMENTS

| | | |
|---|---|---|
| JP | 2000-347782 | 12/2000 |
| WO | WO 79/13657 | 4/1997 |

* cited by examiner

*Primary Examiner* — Omar Abdul-Ali
(74) *Attorney, Agent, or Firm* — Brinks Hofer Gilson & Lione

(57) ABSTRACT

A multimedia system may include a controller and display that displays status information, menu information, and other information. The information may include multiple status icons representing different status information. Each status icon may provide details regarding a setting or condition of the multimedia system, and may be associated with a system function. A user interface is used to select a status information icon by scrolling through the icons and highlighting the icons sequentially. The system allows a user to select and activate functions quickly by scrolling through status information and activating the functions associated with that information. Menu information or a menu structure may be used to access the functions of the multimedia system.

19 Claims, 7 Drawing Sheets

Fig. 3
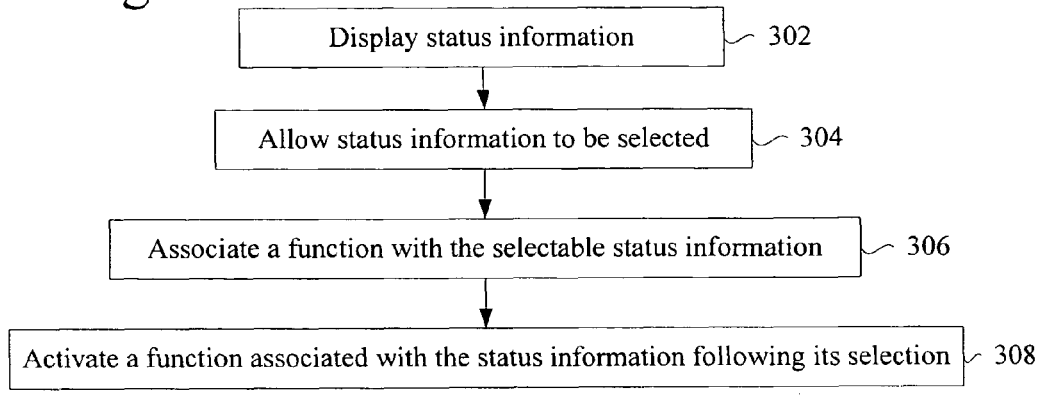
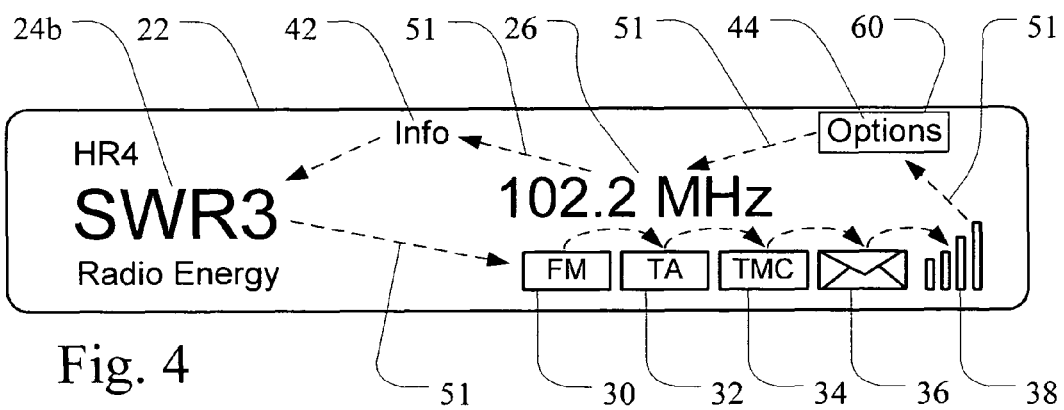
Fig. 4

MULTIMEDIA SYSTEM FOR SELECTING AND ACTIVATING FUNCTIONS

PRIORITY CLAIM

This application is a continuation-in-part of copending international patent application PCT/EP2005/004630 filed on Apr. 29, 2005, designating the U.S., which claims priority of European patent application EP 04 010 242.8, filed on Apr. 30, 2004, both of which are incorporated by reference herein.

BACKGROUND OF THE INVENTION

1. Technical Field

This application relates to a multimedia system that may be used in a vehicle.

2. Related Art

Multimedia systems may include a variety of functions and features. These systems may fit into a dashboard. Space may be limited by the dimensions of a front panel. The front panel of a multimedia system may only allow a number of selection keys for displaying information and selecting menus.

Multimedia systems may offer many different functions or options. A hierarchically structured menu may provide access to many functions. A hierarchically structured menu may include a root menu item at a main menu level and a number of menu items accessible at one or more submenu levels. The number of functions and options offered by multimedia systems is continually increasing. This requires additional keys, buttons, and displays to browse through the many functions and options of a system. A user may have to pass through many sub-menus to reach a desired item. A selection may take time that may divert a driver's attention from traffic or driving conditions. Therefore a need exists for a system that improves resource access while minimizing driver distraction.

SUMMARY

A multimedia system may include a controller and display that displays status information, menu information, and other information. The information may include multiple status icons representing different status information. Each status icon may provide details regarding a setting or condition of the multimedia system, and may be associated with a system function. A user interface is used to select a status information icon by scrolling through the icons and highlighting the icons sequentially. The system allows a user to select and activate functions quickly by scrolling through status information and activating the functions associated with that information. Menu information or a menu structure may be used to access the functions of the multimedia system.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention may be better understood with reference to the following drawings and description. The components in the figures are not necessarily to scale, emphasis instead being placed upon illustrating the principles of the invention. Moreover, in the figures, like referenced numerals designate corresponding parts throughout the different views.

FIG. 3 is a flow chart of a method of using a multimedia system.

FIG. 4 is a diagram of a status information screen in a multimedia system.

DETAILED DESCRIPTION OF THE PREFERRED EMBODIMENTS

Figure 1:
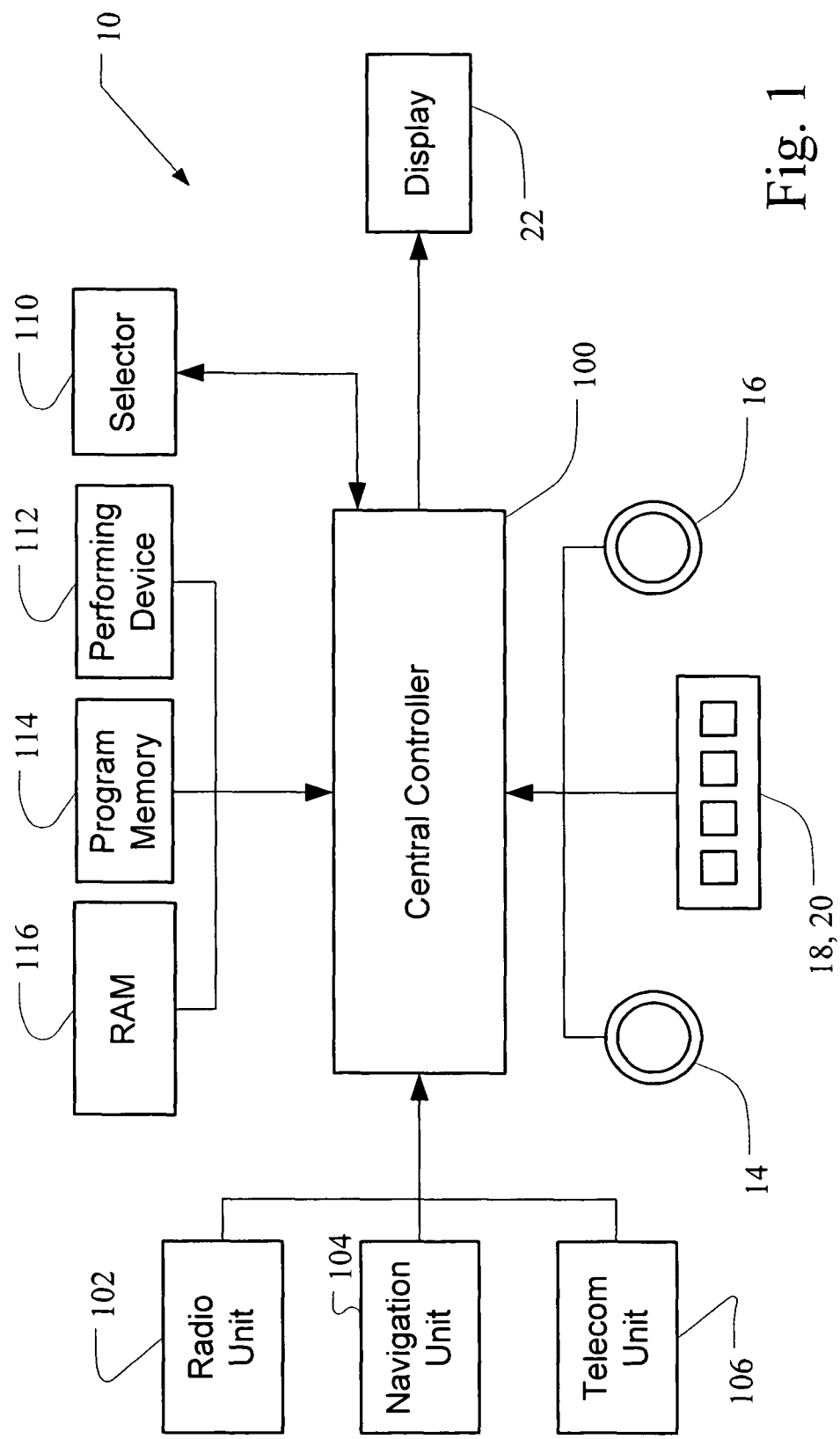
FIG. 1 is a block diagram of a multimedia system.

FIG. 1 is a block diagram of a multimedia system 10. The multimedia system 10 may be used in an automobile, vehicle, or device for transporting people or things. The multimedia system 10 may comprise a central controller 100 that is configured to control functions and services of the multimedia system 10. The central controller 100 may comprise a processor, a digital signal processor, an application specific integrated circuit, a field programmable gate array, a digital circuit, an analog circuit, or combinations. In alternative systems, the central controller 100 comprises software.

The controller 100 couples a receiver or a radio unit 102 that comprises an electronic circuit or device used to select signals for amplification and conversion into sound. The controller 100 comprises software that enables an interface to connect with a navigation unit 104. The navigation unit 104 may comprise global positioning system (GPS). A telecommunications unit 106 may also be coupled to the controller 100, which may include a telecommunication interface. The telecommunication interface may connect to telephone through a cellular network, Internet through a wireless fidelity (WiFi), short messaging service ("SMS"), or other wireless network.

The controller 100 may be coupled to control elements like the rotary pushbutton switches 14 and 16 and the push-button switches 18 and 20 shown in FIG. 1. The control elements may comprise a user interface that receives commands or instructions from a user. The commands may include selection or activation of menu items or status information. Other user inputs or control elements that interface the controller may include a number pad, a keypad, a cursor control device, a joystick, a touch screen display, a remote control or other device operative to interact with the multimedia system 110. The switches 14, 16, 18, and 20 may activate menu options in the multimedia system 10.

The central controller 100 may couple and drive a display 22. In some multimedia systems 10, the display 20 may comprise a touch-screen that allows for a user to interact with the multimedia system 10, an interface, or the software stored in the central controller 100. The display 20 may usually show functions, options, or menus available in the multimedia system 10. The display 22 may comprise a liquid crystal display (LCD), an organic light emitting diode (OLED), a flat panel display, a solid state display, a cathode ray tube (CRT), or other display devices.

The vehicle multimedia system 10 further comprises a selector device 110 that couples the central controller 100. The selector device 110 is configured to select information on the display 22. The selector device 110 may highlight or select information or options shown on the display 22. The selector device 110 communicates with the central controller 100 and is coupled to a performing device 112. The performing device is configured to perform a function assigned to a switch or perform a function associated with the selector device 110. The selector device 110 is configured to select or activate a function associated with status information. In one system, the selector device 110 may enable and disable the highlighting of status information to indicate its selectability. The performing device 112 may comprise a memory storing software. The program may then be run in the central controller 100.

The vehicle multimedia system 10 may comprise a program memory 114 and a random access memory 116 that may be read from or written to in a vehicle. The program memory 114 or RAM memory 116 may store instructions to be executed by the central controller 100. The functions, acts or tasks illustrated in the figures or described may be performed by the central controller 100 executing the instructions stored in either the program memory 114 or RAM memory 116. The functions, acts or tasks are independent of the particular type of instructions set, storage media, processor or processing strategy and may be performed by software, hardware, integrated circuits, firm-ware, micro-code, operating alone or in combination. Processing strategies may comprise multiprocessing, multitasking, and parallel processing. The program memory 114 or RAM memory 116 may comprise a main memory, a static memory, or a dynamic memory. The program memory 114 or RAM memory 116 may comprise a computer readable storage media such as volatile and non-volatile storage media, that may include a random access memory, read-only memory, programmable read-only memory, electrically programmable read-only memory, electrically erasable read-only memory, flash memory, magnetic tape or disk, optical media and the like. Alternatively, the program memory 114 or RAM memory 116 may be a unitary part of the central controller 100. The program memory 114 may be an external storage device or database for storing data. The program memory 114 may comprise a hard drive, compact disc ("CD"), digital video disc ("DVD"), memory card, memory stick, floppy disc, universal serial bus ("USB") memory device, or any other device operative to store data.

The block diagram shown in FIG. 1 illustrates functional units of the vehicle multimedia system 10. The functional units may be combined in a single hardware unit or may comprise separate units. In one system, the performing device 112 and the selector device 110 may be part of the controller 100. In addition, the functional units may be implemented in software or hardware. In particular, the selector device 110 may be comprise hardware or software.

Figure 2:
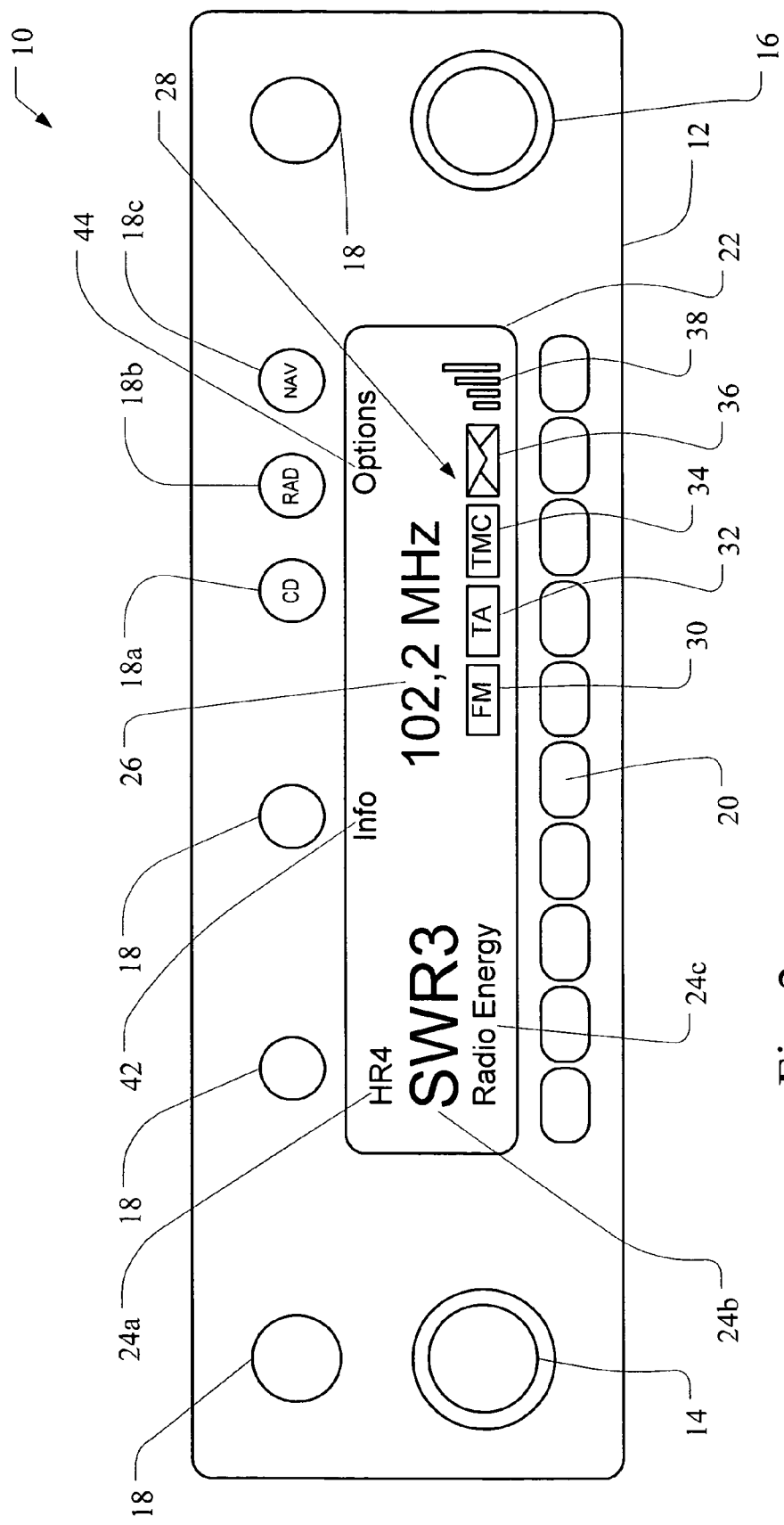
FIG. 2 is a diagram of a multimedia system.

FIG. 2 is a diagram of a multimedia system 10. A front panel 12 may be coupled to the dash or elsewhere in a vehicle. Alternative multimedia system is disclosed in U.S. Pat. No. 6,373,472 B1, which is incorporated by reference herein. The alternate system is used to control the values of a plurality of features in a vehicle and display information from the vehicle to the driver. In FIG. 2, components of the multimedia system 10 are disposed in the dashboard or may be positioned within the vehicle. In one system, a component delivering navigation and telecommunication services is coupled to the multimedia system 10. The navigation and telecommunication components may be remote from other components. In one system, the navigation unit 104 and telecommunications unit 106 may comprise multiple devices remote from the multimedia system 10. The multiple device may form part of the multimedia system 10. Alternatively, the functionality of the devices may be combined with other components or may form a unitary device with the multimedia system 10. When multiple devices are used, the devices may have a plurality of connectors allowing connections with hardware, such as earphones, GSM antenna, GPS antenna, hand-free microphone, radio antenna, loudspeaker, etc.

The multimedia system 10 may offer many different functions and services, such as radio, CD, MP3, video, navigation, telephone, e-mail, web browsing, SMS, etc. Each function or service may be selected by a user through the front panel 12. The front panel 12 comprises a multi-state circuit element that allows the user to choose one of two or more possible states. In FIG. 2, the circuit element comprises a dual function rotary push-button switch 14. The switch may control volume through a rotation and may switch on and off the car multimedia system 10 by pushing the switch 14. A second rotary push-button switch 16 may provide multiple functions. The functions may include selection of a menu item by rotating and activation by pushing the rotary push-button switch 16. In alternate systems, the switches may control more (e.g., there, four, or more) or less functions (e.g., a single function). Additional switches may also be used.

Selection keys, such as push-button switches 18 may be positioned on the front panel 12. Three selection keys are shown as 18a, 18b and 18c. The selection keys 18 may activate a predetermined function of the multimedia system 10. In one system, the CD function may be activated by selection key 18a, the radio function may be activated by selection key 18b, and the navigation function may be activated by selection key 18c. A single function selection key may function as a "hard key".

In addition to hard keys, the front panel 12 may also have soft keys 20. The soft keys 20 may select variable functions. The functions may depend on the mode in which the car multimedia system is operated. If the multimedia system 10 is in a CD mode, then the soft keys 20 may correspond to functions associated with the playing of a CD. As shown, ten soft keys may be positioned in the lower margin area of the front panel 12. The hard keys may be assigned a static function regardless of the mode. The soft keys may be assigned variable functions that depends on the mode of operation.

The display 22 may be positioned in the center of the front panel 12. In one system, the display 22 may comprise a dot matrix display that may display of several lines of information. The information may comprise characters, words or pictures, icons or pictograms. Menu information may include menu items belonging to a hierarchically structured menu system for the multimedia system for operating its several functions. The displayed information may comprise status information or menu information. In some systems, status information refers to information indicating a setting and/or condition of the multimedia system. A menu item may not give the user information about a setting or condition of the system. The menu item may allow selection and/or activation of a predetermined function, such as to change a setting. Status information may comprise information informing the user about a setting or condition of the car multimedia system 10. Status information may be the volume, selected waveband (Ultrakurzwelle (UKW), Mittelwelle (MW), Langwelle (LW), amplitude modulation (AM), frequency modulation (FM)), the mode of traffic announcement (on, off), traffic message channel, the selected program type, map scale, CD number, title number, signal strength, volume level, GSM provider, cellular provider, wireless provider, a mail icon informing about a received message, etc.

The status information shown on the display 22 may be used to perform an assigned function. The status information may be selectable and may be activated like menu items. The user may change a setting or condition of the multimedia system 10 by operating a control element to select and/or activate the setting or condition associated with particular status information. In response to an activation, an assigned function may be performed such as a "display received message" function, enabling the user to read the message on the display. The use of selectable status information simplifies the operation of a multimedia system by minimizing the need to call a menu and navigate through the respective menu and sub-menu levels to reach a desired menu item. The status information may provide a shortcut to a desired menu item or function.

In FIG. 2, the display 22 shows status information, menu information, and radio information. The status information may relate to settings of the radio unit 102. A radio status screen may contain three lines of radio station names 24a-c, which may be a part of a longer list containing more radio station names, which may be received by the radio unit 102. The name of the selected radio station 24b may be displayed with a larger font to differentiate it from the other radio station names that were not selected. For the selected radio station name 24b, the respective frequency of radio station 24b may be displayed and indicated with reference numeral 26.

In one system, status information may be shown as icons 30-38 in the lower right margin area of the display 22. The waveband icon 30 may indicate the selected waveband. In one system, the function associated with status information may jump into or view a menu associated with the status information. The function associated with the status information may call a menu that allows the user to select and activate a menu item. This function may be used when a setting change is more complex than a two state switch. The function may display a list of selectable menu items when the status information is selected. If the status information is "waveband" as in the waveband icon 30, a list of different items, such as UKW, MW, LW, AM, FM may be displayed. The user may then select one of these menu items as the waveband setting.

The traffic icon 32 may relate to the traffic announcement mode (TA) and indicates whether the traffic announcement mode is switched on or off. In one system, a textual indicator, such as "TAM" (traffic announcement mode) may be shown in a normal type face, style and/or weight when switched on and shown in a second typeface (e.g. Arial), style (e.g. italics), highlight, and/or weight (e.g. bold) when switched off. In one system, the function associated with status information may turn on or off a particular mode assigned to that status information. In other words a user may toggle a setting on and off in the multimedia system by selecting and activating the associated status information. If the status information is a "traffic announcement" as with traffic icon 32, the user may switch on and off this setting by selecting and/or activating the status information through the traffic icon 32 associated with the "traffic announcement." The toggling on and off may be a setting that establishes either "traffic announcement on" or "traffic announcement off".

The traffic channel icon 34 may relate to the traffic message channel mode (TMC) indicating that the multimedia system may receive traffic messages which may be considered or used by the navigation unit for route guidance. The telecom icon 36 may relate to a condition of the telecommunications unit. In one system the telecom icon 36 indicates when a message is received. The received message may be an email, voicemail, SMS message, or another message. The telecom icon 36 may correspond to one or more inboxes and identify a location of a new message (e.g. in one or more of the inboxes). The telecom conditions icon 38 may relates to a condition of the telecommunications unit. In one system the telecom conditions icon 38 may reflect a signal strength such as a GSM signal strength. Alternatively, the telecom conditions icon 38 may reflect a wireless network strength, or another cellular network strength.

The status information icons 30-38 may not only be displayed on the radio status information screen as shown in FIG. 2, but may also be part of other status information screens. The icons 30-38 may be shown on the navigation screen or a telecommunications screen. On the navigation screen, route guidance information or a map, may be displayed instead of the radio information. On the telecommunications screen, any information relating to telecommunications services may be displayed. At least some of the status information icons 30-38 may not relate directly to the main status information. The status information icons 30-38 may indicate settings and modes of different functions or services for the multimedia system 10.

The radio station information screen shown on the front panel 12 in FIG. 2 may contain further status information 42 and options 44. This status information 42 may be the program type selected by the user. In one system, the user may filter the list of receivable radio stations by a program classifier, such as info, classic, pop, etc. As shown in FIG. 2, the selected program type is "info". The options 44 may be selected to active a menu for changing or adjusting settings or modes of the multimedia system 10.

The change or adjustment of settings or modes of the multimedia system, such as to enable or disable the traffic announcement mode or to display traffic messages, may occur by selecting and activating the respective menu items from the menu system. In some applications, a user may navigate through submenu levels to find the desired menu item; particularly, if the desired setting or mode does not relate to the main status information displayed on the screen. In one system, the status information may be selectable or active. When active, the user may change the mode of the multimedia system 10 through the icons 30-38.

In one system, the selector device 110 enables and disables the highlighting of status information to indicate its selectability. In particular, the status information icons may each be selectable; however, highlighting may be used to indicate which icon may currently be selected. Alternatively, mechanisms other than highlighting may be used to indicate the selectability of status information. A change in color or font may also indicate that status information is currently selected or selectable. The selector device 110 may remove highlights after a predetermined time period expiring without operating a control element. Although status information may not be highlighted, the selectability of respective status information may be maintained on a display. The user may activate the function assigned to the selected status information by operating the control element without re-selecting additional status information.

A user may select the status information "traffic announcement" by navigating the control element to highlight and select that item. The selection may switch on and off the traffic announcement. In one system, the user may switch on and off the traffic announcement by just one operation of the control element as long as the status information remains highlighted after a period of time. Alternatively, the highlighting of a status information icon may be cleared after a predetermined period of time, and a default status information icon may be highlighted. The user may have to reselect particular status information after a time period lapses.

FIG. 3 is a flow chart of a method of using a multimedia system. In block 302, the status information is displayed through icons 30-38. In block 304, the status information is selectable. In block 306, the respective status information is associated with a particular function. In some processes, the waveband icon 30 may enable a waveband, the traffic icon 32 may enable the traffic announcement mode (TA), the traffic channel icon 34 may enable the traffic message channel mode (TMC), the telecom icon 36 may enable a telecom condition detection mode, and the signal strength icon 38 may enable the telecom or meter mode. Each of the status information icons 30-38 may be associated with one function. In block 308, the function associated with the status information icon may be activated by the selection of that status information icon. The telecom mode may be activated by the selection of the telecom icon 36.

FIGS. 4-10 show alternate views of the display 22. The display 22 may have similar status information and similar menu items as shown in FIG. 2. In FIG. 4, arrows 51 are positioned between various status information or menus. In one system, one arrow 51 may link the menu item 44 with the frequency information 26, which in turn may be linked with the status information program type 42. This status information 42 may be linked through arrow 51 with the radio station name 24b which, in turn, may be linked with the waveband icon 30. This waveband icon 30 may be linked with the traffic icon 32 which may be connected with the traffic channel icon 34, that is linked to the telecom icon 36 that is linked to the signal strength icon 38. An arrow 51 may be linked with the menu item 44. The chain of arrows 51 between status information and menu items may illustrate the order in which the status information and menu items are selectable. In some systems the items linked with arrows 51 are each selectable and are selectable in a sequential order of the arrows 51. The multimedia system 10 may allow a user to move a selection mark (or cursor) from one status information to the next. The sequence may occur according to the order indicated by the arrows 51 and in response to an operation of the rotary push-button switch 16 or other control element.

In FIG. 4, a selection mark 60 may identify the selected item and may be displayed as a highlighting of the menu item "options" 44. The selection mark 60 may be moved in a sequence between icons. In FIG. 4, the selection mark may move from menu item 44, to status information 26, to program type information 42, to radio station name 24b, to waveband icon 30, to traffic announcement icon 32, to traffic message channel 34, to menu icon 36, to signal strength icon 38 and then back to the menu item "options" 44 in the sequence shown by the arrows 51. The movement of the selection mark 60 may occur by rotating the rotary push-button switch 16 in a counterclockwise direction. A rotation of the rotary push-button switch 16 in the clockwise direction may reverse the order of selection. Each selectable status information or menu item on the display 22 may be assigned a function, which may be performed (activated) by pushing the rotary push-button switch 16. One function may switch on and off a setting or mode or to display a menu.

Figure 5:
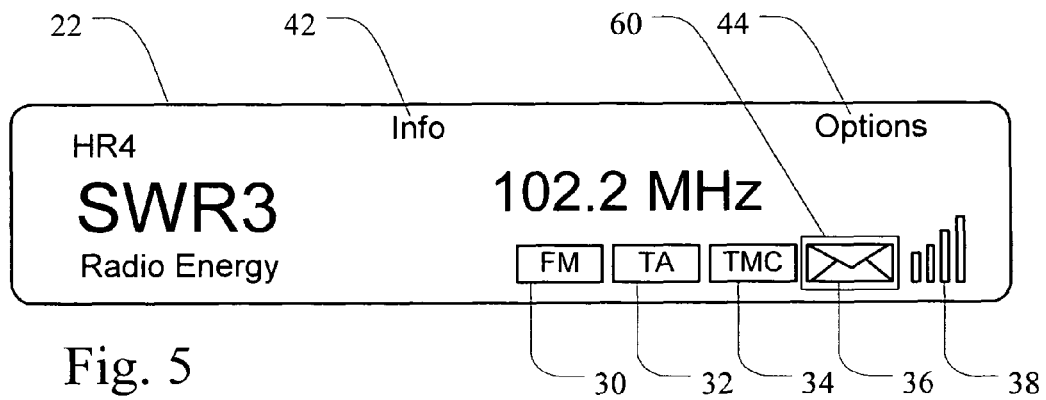
FIG. 5 is a diagram the status information screen of FIG. 2 with an icon highlighted.
Figure 6:
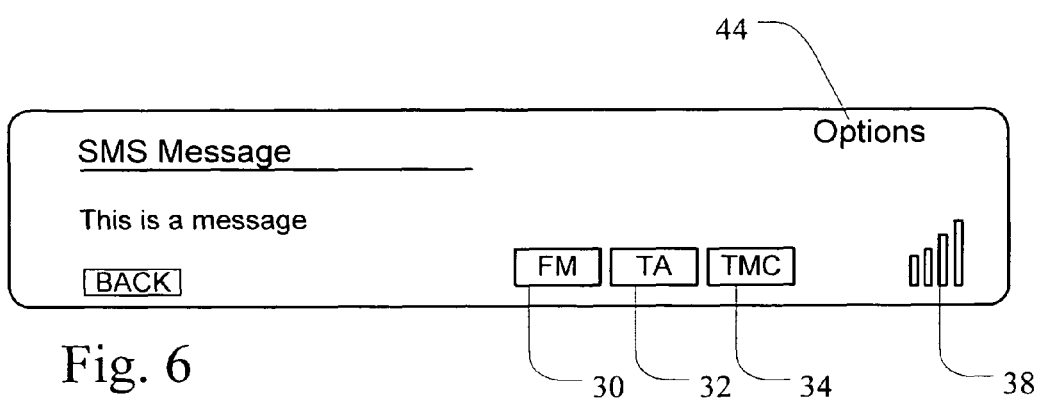
FIG. 6 is a diagram of a message screen.

FIGS. 5 and 6 illustrate one function associated with status information on display 22. In FIG. 5, the mail icon 36 may be highlighted by advancing the selection mark 60 on to the mail icon 36. The selection mark 60 may be moved by advancing the rotary push-button switch 16 in a clockwise or a counterclockwise direction. The selection mark 60 may be a highlight that indicates the highlighted icon may be activated or selected to perform a function assigned to the icon. To perform the function assigned to this mail icon 36, the user pushes (activates) the rotary push-button switch 16 after mail icon 36 has been selected. As a result, display 22 is changed, as shown in FIG. 6 to display a message.

In FIG. 6, an SMS message is displayed. Messages from e-mail, instant messages, voicemail, or SMS messages may also be displayed. The mail icon 36 function may display a received message. The selection and activation of status information such as the mail icon 36 may allow the user to avoid navigating through complex menus to view mail. In FIG. 6, the mail icon 36 disappears after its selection and activation, but may reappear to indicate new or unread messages. When the "read message" function is performed, the message is flagged as a read message and the mail icon 36 disappears. The remaining status information icons 30, 32, 34 and 38 may be displayed and may be selected by the user regardless of the mode of display. A "back" menu icon may be displayed that allows a user to return to a previous screen, as shown in FIG. 5. In one system, the multimedia system 10 may change to a previous screen after a predetermined period of time.

The status information icons 30, 32, 34 and 38 may be highlighted, selected and/or activated to perform the respective assigned function in a similar process. In one system, if the waveband icon 30 is selected and activated, the multimedia system 10 may display a list of different wavebands the user may select. Such a list may comprise (in Germany) UKW, MW or LW (Ultrakurzwelle, Mittelwelle, Langwelle) or AM, FM (in the United States). By operating the rotary push-button switch 16 or other control element, the user may then select the desired waveband.

If the user selects and activates the traffic announcement icon 32. The user may toggle between a traffic announcement on mode and traffic announcement off mode. The traffic announcement on mode may be displayed in bold characters TA, and the traffic announcement off mode may be indicated by Italic characters TA. If the user selects and activates the TMC icon 34, the received and stored traffic messages may be displayed on the display 22 like the SMS message as shown in FIG. 6. In one system, if the user selects and activates the signal strength icon 38, a screen that can receive a telephone number may be generated and displayed. The functions assigned to the status information icons may vary. In some systems, the status information may comprise additional icons and functions.

The function associated with status information may differ based on the method in which the status information is selected or activated. The selection may be through a control element, such as the rotary buttons 14, 16, or another multi-function control element or device. Different functions may be performed in response to the activation of a particular control element. In some systems, the control element may facilitate a long activation or a short activation depending on the length of activation of the control (e.g., how long a button is activated). For particular status information, a short activation may trigger the on/off toggle function, while a long activation may trigger a menu display. Two unique functions may be assigned to one status information, which may be activated by a short or long activation engagement of the control element. In one system, with the traffic icon 32, selecting a first or short function may turn on or off the function. A second or long function may call a respective menu that allows the changing of other settings related to the traffic announcement mode, such as the volume of the traffic announcement, radio station, etc.

Figure 7:
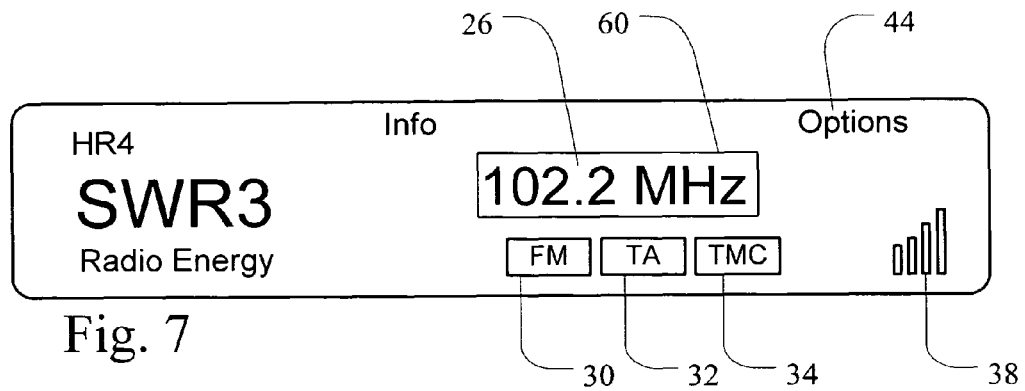
FIG. 7 is an alternate diagram of a status information screen.
Figure 8:
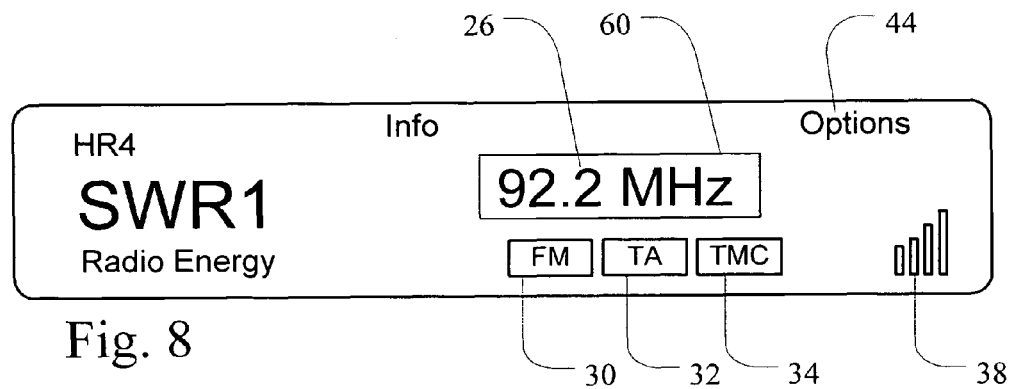
FIG. 8 is an alternate diagram of a status information screen.

FIGS. 7-10 are alternate diagrams of a status information screen with alternate selections of a status information icon. In FIG. 7, the selector mark 60 is positioned to select the frequency information 26. If a user activates frequency information 26 by pushing the rotary push-button device, the function assigned to the frequency information 26 may be activated. The user may be allowed to change the frequency of the radio by turning the rotary push-button device 16. In FIG. 8, the frequency is changed from 92.2 MHz to 102.2 MHz. A first function assigned to the frequency status information 26 may call an editing mode. A second function assigned to the frequency status information 26 and activatable by different operation of the rotary push button device may initiate a frequency scan. Alternatively, other functions are also possible, such as a first function that may call a menu, which allows for the adjustment of the pitch or the manual adjustment of the frequency.

Figure 9:
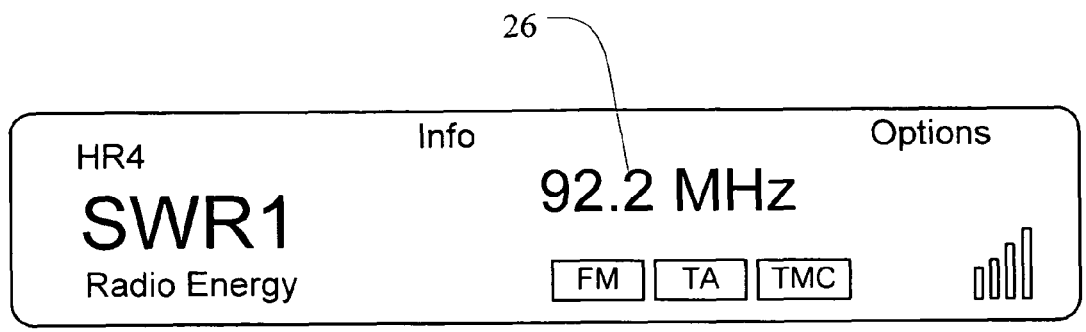
FIG. 9 is an alternate diagram of a status information screen.
Figure 10:
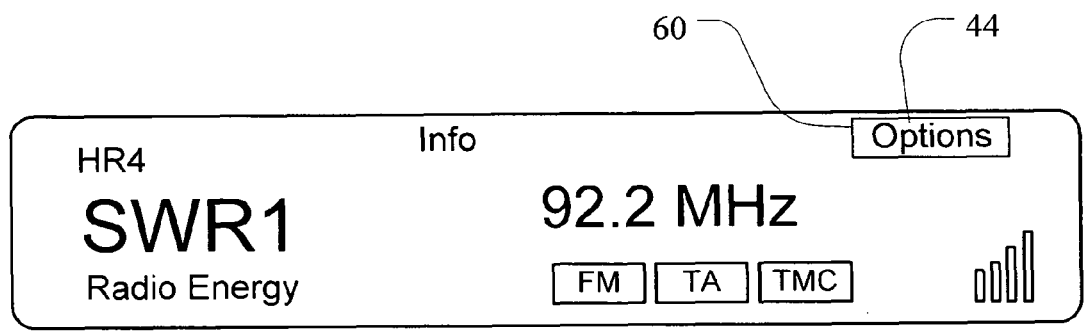
FIG. 10 is an alternate diagram of a status information screen.

After a selection and activation performs a desired function, there may be alternatives how the multimedia system proceeds further. The selection mark 16 may disappear as shown in FIG. 9. Although the selection mark 16 is not seen, the frequency status information 26 may be selected and may be activated. This allows the user to change the frequency even at a later time by activating the rotary pushbutton switch 16. Alternatively, shown in FIG. 10, the selection mark 60 may return to a default menu automatically without user interaction. The selection mark 60 may automatically return to the menu item "options" 44 after a period of time. The multimedia system 10 allows for the selection of status information. A selection may activate a function assigned to the respective status information. This function may enable or disable a respective mode or allow more complex settings or options.

In other multimedia systems, status information may serve as an identification to a user. A mail icon may indicate that new mail has been received. New mail viewing may require navigating through a hierarchical menu. Alternatively, status information that is selectable and associated with a function may improve ease of use. The user may scroll through all of the status information and may be able to activate the status information to perform the associated function as in FIG. 11.

Figure 11:
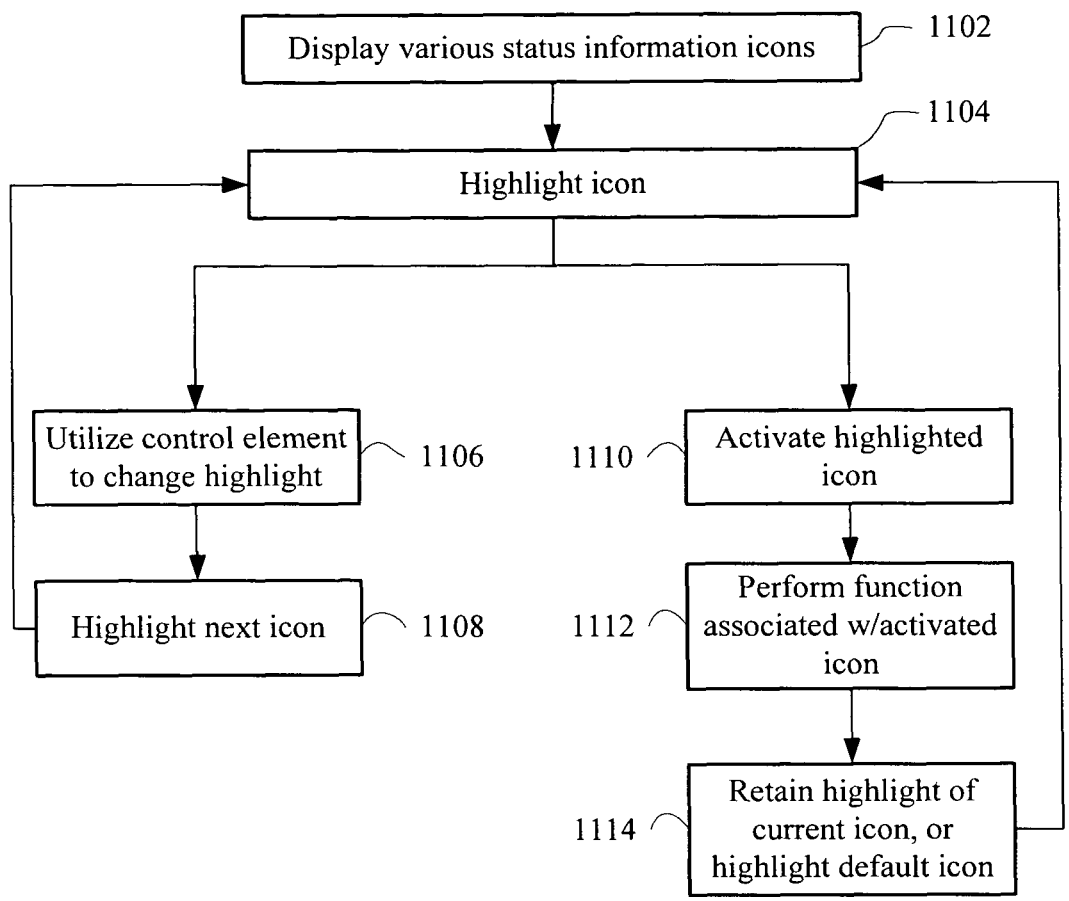
FIG. 11 is a flow chart illustrating a method of using a multimedia system.

FIG. 11 is a flow chart illustrating the use of a multimedia system. In block 1102, the system displays various status information icons. Each of the status information icons may be associated with one function or more. In alternate systems, status information may not be represented by icons, but by text or other symbols. In block 1104, a status information icon is highlighted. The highlighted icon may be a default icon or may be a previously user-selected icon. In block 1106, the user may use a control element to change the highlighted icon. In one system, a control element may be a rotary dial that navigates through the status information icons and may activate the function of a highlighted icon by depressing the dial. One of the status information icons may be highlighted at a time. The control element may change the icon that is highlighted to highlight the next icon as in block 1108. In alternate systems, highlighting may be replaced with color changes, formatting changes, or font changes to indicate which icon is highlighted. The highlighted icon may be selected with a selection mark 60 as in FIG. 10. The highlighted icon in block 1104 may be activated in block 1110. When a status information icon is activated, a function associated with that status information may be performed as in block 1112. As a function is performed or after it is performed, the same icon may be highlighted, or a default icon may be highlighted as in block 1114. The system may return to a mode where one of the status information icons is highlighted as in block 1104 after performing a function.

The functions described may be implemented in a computer-readable medium. The term "computer-readable medium" may include a single medium or multiple media, such as a centralized or distributed database, and/or associated caches and servers that store one or more sets of instructions. The term "computer-readable medium" may also include any medium that is capable of storing, encoding or carrying a set of instructions for execution by a processor or that cause a computer system to perform any one or more of the methods or operations disclosed herein.

In one system, computer-readable medium may include a solid-state memory such as a memory card or other package that houses one or more non-volatile read-only memories. Further, the computer-readable medium may be a random access memory or other volatile re-writable memory. Additionally, the computer-readable medium may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, one or more of a computer-readable medium or a distribution medium and other equivalents and successor media, in which data or instructions may be stored may be included in the system.

In an alternative system, dedicated hardware implementations, such as application specific integrated circuits, programmable logic arrays and other hardware devices, may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system may encompass software, firmware, and hardware implementations.

In accordance with various systems, the methods described herein may be implemented by software programs executable by a computer system. Further, in an exemplary, non-limited embodiment, implementations may include distributed processing, component/object distributed processing, and parallel processing. Alternatively, virtual computer system processing may be constructed to implement one or more of the methods or functionality as described herein.

Although components and functions may be described as implemented in particular systems with reference to particular standards and protocols, alternate systems are not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

I claim:

1. A multimedia system comprising:
   a controller;

a display coupled to the controller to display status information and menu items where the menu items comprise a hierarchically structured menu system organizing and displaying functions of the multimedia system;
a selector device coupled to the controller that allows the status information to be selected;
a user interface coupled to the controller that receives input comprising selection or activation of the status information or menu items, where the selection occurs by the selector device and where the user interface is configured to cycle the status information; and
a performing device configured to perform a function associated with the status information upon activation of the status information, where the status information comprises information indicative of a setting or a condition of the multimedia system comprising at least one of a radio station identifier, a radio frequency, a waveband, a traffic announcement mode, a traffic message channel, a selected program type, a map scale, a CD number, a title number, a GSM provider, a signal strength, a volume level, a mail icon, or a combination.

2. The multimedia system of claim 1 where the user interface is a control element.

3. The multimedia system of claim 2 where the control element comprises at least one of a rotary push button, hard key, soft key, touch screen display or a combination.

4. The multimedia system of claim 3 where the rotary push button allows a user to cycle through the status information, and further where a selection of the status information highlights the status information selected.

5. The multimedia system of claim 3 where the rotary push button receives a first input associated with a short activation and receives a second input associated with a long activation.

6. The multimedia system of claim 2 where the control element comprises at least one of a number pad, a keypad, a cursor control device, a joystick, remote control, or a combination.

7. The multimedia system of claim 1 further comprising a receiver configured to play radio stations.

8. The multimedia system of claim 1 further comprising a compact disc unit.

9. The multimedia system of claim 1 further comprising a navigation unit configured to give directions or locate a position of the multimedia system.

10. The multimedia system of claim 1 further comprising a telecommunication unit configured to at least one of receive electronic communications, connect with a network, send messages, establish a call, or a combination.

11. A multimedia system for a transport mechanism comprising:
a display configured to display menu items and status information, where the status information provides information indicative of a setting or a condition of the multimedia system and where the menu items comprise a hierarchically structured menu system organizing and displaying functions of the multimedia system;
a controller coupled to the display that drives the display; and
a user interface coupled to the controller that receives instructions comprising a selection or activation of the menu items and the status information, where the controller displays the selection on the display;
where the controller is configured to allow the status information to be selected by the user interface as shown on the display, and the controller performs a function associated with the activation of the menu items or the status information, where the status information comprises information indicative of a setting or a condition of the multimedia system comprising at least one of a radio station identifier, a radio frequency, a waveband, a traffic announcement mode, a traffic message channel, a selected program type, a map scale, a CD number, a title number, a GSM provider, a signal strength, a volume level, a mail icon, or a combination.

12. The multimedia system of claim 11 where the user interface comprises a combination of at least one of a rotary push button and a hard key or a soft key, or a touch screen display.

13. The multimedia system of claim 12 where the controller allows a user to cycle through the status information with the rotary push button.

14. The multimedia system of claim 11 where the function associated with the status information switch on and off a mode assigned to the status information when the status information is activated.

15. The multimedia system of claim 11 where the function associated with the status information activates a menu assigned to the status information when the status information is activated.

16. A multimedia system comprising:
a display configured to display status information and menu items where the menu items comprise a hierarchically structured menu system organizing and displaying functions of the multimedia system;
a control element for selecting and activating a menu item;
a control device that drives the display and is coupled to the control element to receive selections and activations;
a selector device configured to allow the status information to be selected with the control element; and
a performing means for performing a function associated with the status information upon selection of the status information, where the status information comprises information indicative of a setting or a condition of the multimedia system comprising at least one of a radio station identifier, a radio frequency, a waveband, a traffic announcement mode, a traffic message channel, a selected program type, a map scale, a CD number, a title number, a GSM provider, a signal strength icon, a volume level, a mail icon, or a combination.

17. A method for selecting and activating a function of a multimedia system comprising:
displaying status information and menu items on a display of the multimedia system;
selecting the status information, where the status information comprises information indicative of a setting or a condition of the multimedia system comprising at least one of a radio station identifier, a radio frequency, a waveband, a traffic announcement mode, a traffic message channel, a selected program type, a map scale, a CD number, a title number, a GSM provider, a signal strength, a volume level, a mail icon, or a combination; and
activating a function assigned to the status information in response to its selection.

18. The method of claim 17, further comprising displaying a list of radio stations for selection when status information for a radio station is selected.

19. The multimedia system of claim 18, where a selection of the signal strength icon displays signal strength received from a cellular network or WiFi network.

* * * * *